US011824327B2

(12) United States Patent
Michaels et al.

(10) Patent No.: US 11,824,327 B2
(45) Date of Patent: Nov. 21, 2023

(54) SILICON-ASSISTED PACKAGING OF HIGH POWER INTEGRATED SOA ARRAY

(71) Applicant: OURS Technology, LLC, Mountain View, CA (US)

(72) Inventors: Andrew Steil Michaels, Santa Clara, CA (US); Lei Wang, Fremont, CA (US); Sen Lin, Santa Clara, CA (US)

(73) Assignee: OURS TECHNOLOGY, LLC, Mountain View, CA (US)

( * ) Notice: Subject to any disclaimer, the term of this patent is extended or adjusted under 35 U.S.C. 154(b) by 0 days.

(21) Appl. No.: 17/863,807

(22) Filed: Jul. 13, 2022

(65) Prior Publication Data
US 2022/0352695 A1 Nov. 3, 2022

Related U.S. Application Data

(63) Continuation of application No. PCT/US2021/012759, filed on Jan. 8, 2021.
(Continued)

(51) Int. Cl.
*H01S 5/40* (2006.01)
*B60R 16/02* (2006.01)
(Continued)

(52) U.S. Cl.
CPC .......... *H01S 5/4075* (2013.01); *B60R 16/02* (2013.01); *G01S 7/4814* (2013.01); *G01S 17/08* (2013.01); *G01S 17/32* (2013.01); *G02B 6/12004* (2013.01); *G02B 6/423* (2013.01); *H01S 3/08* (2013.01); *H01S 5/026* (2013.01)

(58) Field of Classification Search
CPC .......... H01S 5/4075; H01S 3/08; H01S 5/026; B60R 16/02; G01S 7/4814; G01S 17/08; G01S 17/32; G02B 6/12004; G02B 6/423
See application file for complete search history.

(56) References Cited

U.S. PATENT DOCUMENTS 7,158,699 B2   1/2007   Welch et al.
7,734,189 B2   6/2010   Ranganath
(Continued)

FOREIGN PATENT DOCUMENTS

EP    1083642 A2 *  3/2001  ......... G02B 6/12011

OTHER PUBLICATIONS

International Searching Authority, Patent Cooperation Treaty, International Application No. PCT/US2021/012759, dated Mar. 26, 2021, 12 pages.

*Primary Examiner* — Yuanda Zhang
(74) *Attorney, Agent, or Firm* — Dority & Manning, P.A.

(57) ABSTRACT

A photonic integrated circuit (PIC) assembly comprising a semiconductor optical amplifier (SOA) array and a U-turn chip. The SOA array includes an input SOA and a plurality of SOAs. The input SOA and the plurality of SOAs are arranged parallel to one another. The U-turn chip includes an optical splitter and a waveguide assembly. The optical splitter is configured to receive amplified input light propagating in a first direction from the input SOA, and divide the amplified light into beams. The waveguide assembly guides the beams to a corresponding SOA of the plurality of SOAs, and adjusts a direction of prorogation of each of the guided beams to be substantially parallel to a second direction that is substantially opposite the first direction.

20 Claims, 6 Drawing Sheets

Related U.S. Application Data

(60) Provisional application No. 62/960,688, filed on Jan. 13, 2020.

(51) Int. Cl.
  *G01S 7/481* (2006.01)
  *G01S 17/32* (2020.01)
  *H01S 3/08* (2023.01)
  *H01S 5/026* (2006.01)
  *G01S 17/08* (2006.01)
  *G02B 6/12* (2006.01)
  *G02B 6/42* (2006.01)

(56) References Cited

U.S. PATENT DOCUMENTS

| | | |
|---|---|---|
| 8,837,869 B2 | 9/2014 | Akutsu et al. |
| 8,988,754 B2 | 3/2015 | Sun et al. |
| 9,476,981 B2 | 10/2016 | Yaacobi et al. |
| 10,338,321 B2 | 7/2019 | Hosseini et al. |
| 10,627,517 B2 | 4/2020 | Yaacobi et al. |
| 10,761,272 B2 | 9/2020 | Hosseini et al. |
| 11,150,411 B2 | 10/2021 | Hosseini et al. |
| 11,372,106 B2 | 6/2022 | Yaacobi et al. |
| 2004/0033004 A1* | 2/2004 | Welch ............... H04B 10/2914 385/14 |
| 2008/0240645 A1* | 10/2008 | Funabashi .......... G02B 6/12004 385/14 |
| 2013/0121632 A1* | 5/2013 | Akutsu ............... G02B 6/2766 385/11 |
| 2013/0279910 A1 | 10/2013 | Ziari et al. |
| 2016/0334651 A1 | 11/2016 | Sugaya et al. |
| 2021/0063776 A1* | 3/2021 | Larson ...................... H01S 5/50 |
| 2022/0003937 A1 | 1/2022 | Hosseini et al. |

* cited by examiner

SILICON-ASSISTED PACKAGING OF HIGH POWER INTEGRATED SOA ARRAY

CROSS-REFERENCE TO RELATED APPLICATIONS

This application is a continuation of International Application No. PCT/US2021/012759 filed Jan. 8, 2021, which claims the benefit of and priority to U.S. Provisional Application 62/960,688 filed Jan. 13, 2020. The entire disclosures of International Application No. PCT/US2021/012759, and U.S. Provisional Patent application 62/960,688 are hereby incorporated by reference as if fully set forth herein.

TECHNICAL FIELD

This disclosure relates generally to frequency modulated continuous wave (FMCW) light detection and ranging (LiDAR), more particularly, to solid state FMCW LiDAR systems.

BACKGROUND INFORMATION

Conventional LiDAR systems use mechanical moving parts and bulk optical lens elements (i.e., a refractive lens system) to steer the laser beam. And for many applications (e.g., automotive) are too bulky, costly, and unreliable.

BRIEF SUMMARY OF THE INVENTION

A photonic integrated circuit (PIC) assembly includes a semiconductor optical amplifier (SOA) array and a U-turn chip. The semiconductor optical amplifier (SOA) array includes an input SOA and a plurality of SOAs. The input SOA and the plurality of SOAs are arranged parallel to one another. The U-turn chip includes an optical splitter and a waveguide assembly. The optical splitter is configured to receive amplified input light propagating in a first direction from the input SOA, and divide the amplified light into a plurality of beams. The waveguide assembly is configured to guide each of the plurality of beams to a corresponding SOA of the plurality of SOAs. The waveguide assembly also adjusts a direction of propagation of each of the guided beams to be substantially parallel to a second direction that is substantially opposite the first direction. Each of the plurality of SOAs are configured to amplify their respective beams to generate a plurality of amplified output beams. The PIC assembly may be part of, e.g., a frequency modulated continuous wave (FMCW) LiDAR system.

In some embodiments, the PIC assembly includes a semiconductor optical amplifier (SOA) module. The SOA module includes a SOA array and may also include a U-turn chip (in alternate embodiments the U-turn chip may be part of a PIC chip the SOA module couples to). The SOA array is on a SOA chip. The SOA array includes an input SOA and a plurality of SOAs, and the input SOA and the plurality of SOAs are arranged parallel to one another. The U-turn chip is coupled to the SOA chip, and includes an optical splitter and a waveguide assembly. The optical splitter is configured to receive amplified input light propagating in a first direction from the input SOA, and divide the amplified light into a plurality of beams. The waveguide assembly is configured to guide each of the plurality of beams to a corresponding SOA of the plurality of SOAs, wherein the waveguide assembly adjusts a direction of propagation of each of the guided beams to be substantially parallel to a second direction that is substantially opposite the first direction, and wherein each of the plurality of SOAs are configured to amplify their respective beams to generate a plurality of amplified output beams.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION

Figure 1:
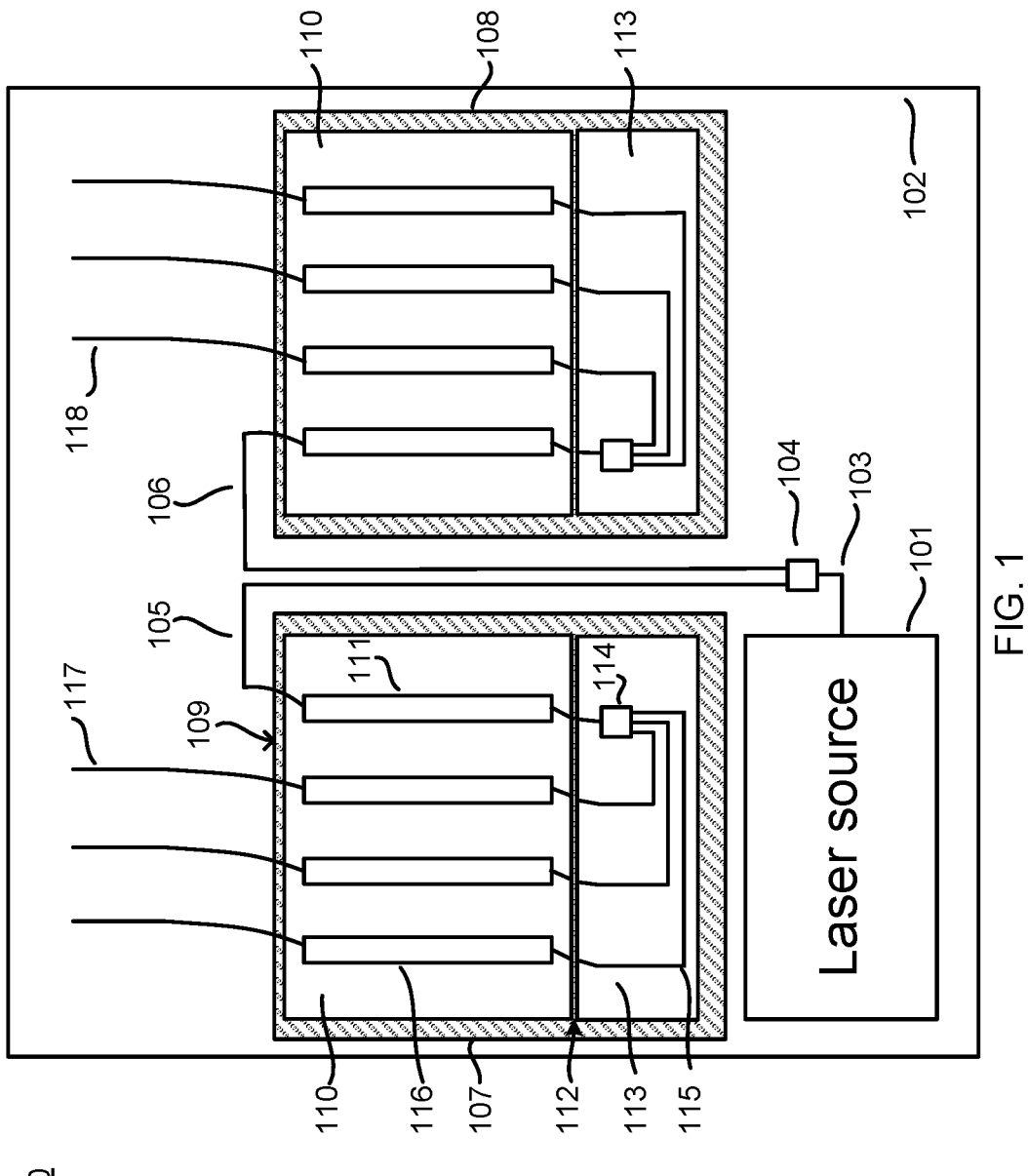
FIG. 1 shows a top-down view of a photonic integrated circuit assembly that includes two SOA array chips and two corresponding U-turn chips that are coupled to a PIC chip, according to one or more embodiments.

A SOA module includes a SOA array (on a SOA array chip) and may include a U-turn chip (in other embodiments the U-turn chip is part of a PIC circuit to which the SOA module couples to), and the SOA module may be coupled to a photonic integrated circuit (PIC) chip. The SOA array includes an input SOA and a plurality of SOAs. In some embodiments, the input SOA is the same as one or more of the plurality of SOAs. In alternate embodiments, the input SOA and the plurality of SOAs may be different (e.g., have different levels of amplification). In some embodiments, each of the plurality of SOAs are configured to provide a same level of amplification. In other embodiments, at least one of the plurality of SOAs provides a different level of amplification than the input SOA and/or another SOA of the plurality of SOAs. The input SOA and the plurality of SOAs may be arranged parallel to one another. The PIC chip, the U-turn chips, or some combination thereof may be made out of silicon, silicon nitride, silicon dioxide, or some combination thereof, while the SOA array chip may be made from III-V compound semiconductor materials composed of Al, Ga, In, N, P, As and other elements.

The U-turn chip includes an optical splitter and a waveguide assembly. The optical splitter is configured to receive amplified input light propagating in a first direction from the input SOA, and divide the amplified light into a plurality of beams. The waveguide assembly guides each of the plurality of beams to a corresponding SOA of the plurality of SOAs. The waveguide assembly also adjusts a direction of propagation of each of the guided beams to be substantially parallel to a second direction that is substantially opposite the first direction. In this manner, the light guided by the waveguide assembly performs a "u-turn" back toward the SOA array.

Each of the plurality of SOAs are configured to amplify their respective beams to generate a plurality of amplified output beams. As the SOA module may be part of a photonic integrated circuit (PIC) assembly, the amplified output beams may be provided to the PIC assembly for use in, e.g., a frequency modulated continuous wave (FMCW) LiDAR system. A FMCW LiDAR directly measure range and velocity of an object by directing a frequency modulated, collimated light beam at the object. The light that is reflected from the object is combined with a tapped version of the beam. The frequency of the resulting beat tone is proportional to the distance of the object from the LIDAR system once corrected for the doppler shift that requires a second measurement. The two measurements, which may or may not be performed at the same time, provide both range and velocity information.

Note that a PIC assembly may include a plurality of SOA modules, a light source, and a plurality of waveguides to provide the light from the light source to the plurality of SOA modules. The plurality of waveguides may also be arranged to provide a similar U-turn functionality. This in combination with the parallel arrangement of the SOAs and the U-turn chip facilitate easy integration and packaging of the SOA module with the PIC chip. In contrast, typical high-power SOA arrays have optical inputs and outputs on opposing sides of the III-V chip. This can make packaging the SOA with other photonics chips costly and difficult.

FIG. 1 shows a top-down view of a photonic integrated circuit (PIC) assembly 100 that includes two SOA array chips 110 (also referred to as an SOA chip) and two corresponding U-turn chips 113 coupled to a PIC chip 102, according to one or more embodiments. The PIC chip 102, the SOA array chips 110, the U-turn chips 113, or some combination thereof may be made out of silicon, silicon nitride, silicon dioxide, or some combination thereof.

The output optical power of an integrated laser source 101 sits on top of the PIC chip 102. The light from this source is coupled into a waveguide 103 which is patterned on the PIC chip 102.

The optical power in the waveguide is split evenly by an optical divider 104 into two output waveguides 105 and 106. The optical divider 104 may be, e.g., a beam splitter. Although in this example, two SOA modules (i.e., 208 and 208) are demonstrated, in other embodiments, a different number of SOA modules may be used. Each of the SOA modules 107, 108 include a respective SOA array chip 110 (also referred to as a SOA chip) and the U-turn chip 113 which are placed in a recessed cavity etched into a top surface of the PIC 102.

As shown the output waveguide 105 is configured to provide the first beam to the SOA module 107 (and specifically to its corresponding SOA array), and the output waveguide 108 is configured to provide the second beam to the SOA module 108 (and specifically to its corresponding SOA array). Note as shown a direction of propagation of the light at entrances of the output waveguide 105 and the output waveguide 106 is substantially opposite a direction of propagation at the outputs of the output waveguide 105 and the output waveguide 106.

Each SOA array chip includes an SOA array. The SOA array includes an input SOA (e.g., input SOA 111) and a plurality of SOAs (e.g., SOA 116). As illustrated the input SOAs and the plurality of SOAs are arranged parallel to one another. In other embodiments, the input SOAs and the plurality of SOAs may have be positioned relative to one another in a different manner.

In the context of the SOA module 107, the output waveguide 105 is edge-coupled to the SOA array chip 110 through the front chip facet 109.

This light passes through the input SOA 111 which acts as a pre-amplifier to offset losses associated with chip-to-chip coupling. The light being amplified is propagating in a first direction.

The pre-amplified light is leaving the SOA is edge-coupled, through the back facet 112 of the SOA chip 110, to the U-turn chip 113.

Light in the input waveguide passes through a 1×M splitter 114 (where M is equal to one minus the total number of SOAs, including the input SOA, in the SOA array 110), which equally distributes the pre-amplified optical power between M waveguides (e.g., waveguide 115) of a waveguide assembly. Each waveguide of the waveguide assembly incudes a guided beam corresponding to some portion of the pre-amplified optical power.

The waveguide assembly adjusts a direction of propagation of each of the guided beams to be substantially parallel to a second direction that is substantially opposite the first direction. For example, these waveguides are bent around and the light is coupled back into the SOA array chip 110 through the back facet 112. Each optical channel then passes through a separate SOA 116 on the SOA array chip, amplifying the light to the desired output level (i.e., each of the plurality of SOAs are configured to amplify their respective beams to generate a plurality of amplified output beams). In some embodiments, each SOA 116 in an SOA array chip is configured to provide a same level of amplification. In other embodiments, at least two of the SOAs 116 have different levels of amplification. Similarly, in some embodiments, a plurality of SOA modules on the PIC chip 102 are the same. And in other embodiments, at least one SOA module on the PIC chip 102 is different from another SOA module on the PIC 102 chip. For example, one SOA module may have a different number of SOAs 116 than another SOA module.

The amplified light is edge-coupled back into the PIC chip 102 through the front chip facet 109 and into the waveguide 117. Light from the output waveguide 106 to the SOA module 108 is amplified in the SOA module 108 in a substantially similar manner as described above for the SOA module 107, and is output to waveguide 118. Waveguides 117 and 118 in the PIC chip 102 carry the light from the packaged SOA arrays to photonic circuits contained in the PIC chip 102.

Figure 2:
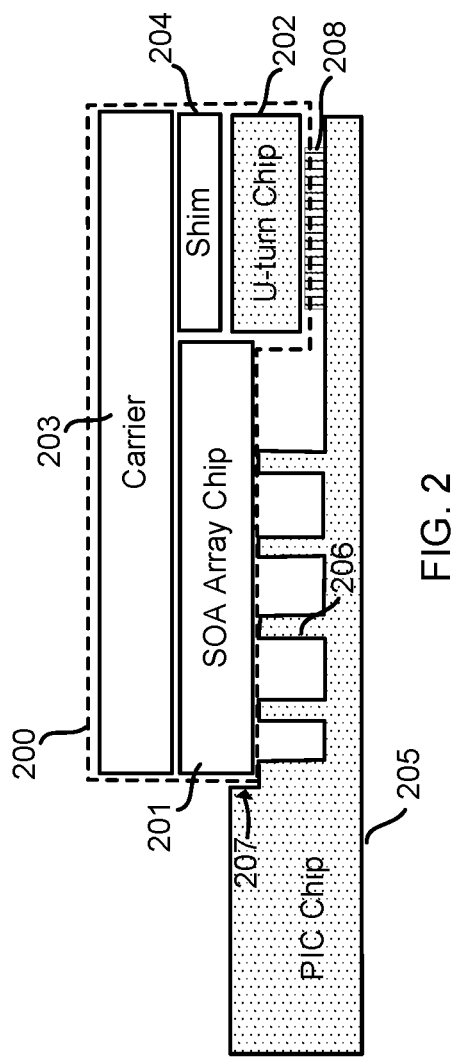
FIG. 2 depicts the cross section of one embodiment of an SOA array module, according to one or more embodiments.

FIG. 2 depicts the cross section of one embodiment of a SOA array module 200 (also referred to as a SOA module) coupled to a PIC chip 205, according to one or more embodiments. A SOA array chip 201 is bonded to a carrier 203 which provides structural support and thermal management. Carrier 203 may be made from silicon, other thermally conductive ceramics such as AlN or Al2O3, or some combination thereof. The SOA array chip 201 may be an embodiment of the SOA array chip 110.

A U-turn chip 202 is actively coupled to the SOA array chip 201 with the assistance of a shim 204 which provides the necessary mechanical offset with respect to the carrier 203. Shim 204 may be made from any material although using materials having similar coefficient of thermal expansion as that of SOA 201 is advantageous because alignment between SOA 201 and U-turn 202 can be better preserved over temperature swings. The U-turn chip 202 is an embodiment of the U-turn chip 113. The U-turn chip 202 is thinned such that the combined module fits in a recess etched into a PIC chip 205. This arrangement of bonded SOA array chip 201, carrier 203, shim 204, and U-turn chip 202 form the SOA array module 200.

The SOA array module 200 is then placed on the PIC chip 205 which makes use of the optical power provided by the SOA array chip 201. The PIC chip 205 contains patterned pedestals 206 which provides mechanical support, precise out-of-plane alignment, and a means of fixing the SOA array chip 201 to the PIC chip 205. The SOA array module is placed on top of these pedestals 206 and its front facet is brought in close proximity to a chip facet 207 and actively aligned to provide efficient optical coupling between the SOA array chip 201 and the PIC chip 205. Note that in the illustrated embodiment, the U-turn chip 202 is on an opposite side of the SOA array chip 201 than the chip facet 207. In other embodiments, the location of the chip facet 207 relative to the U-turn chip 202 may vary.

If needed for additional support, the U-turn chip 202 may be bonded to the silicon photonics chip with a low-shrinkage adhesive 208.

Figure 3:
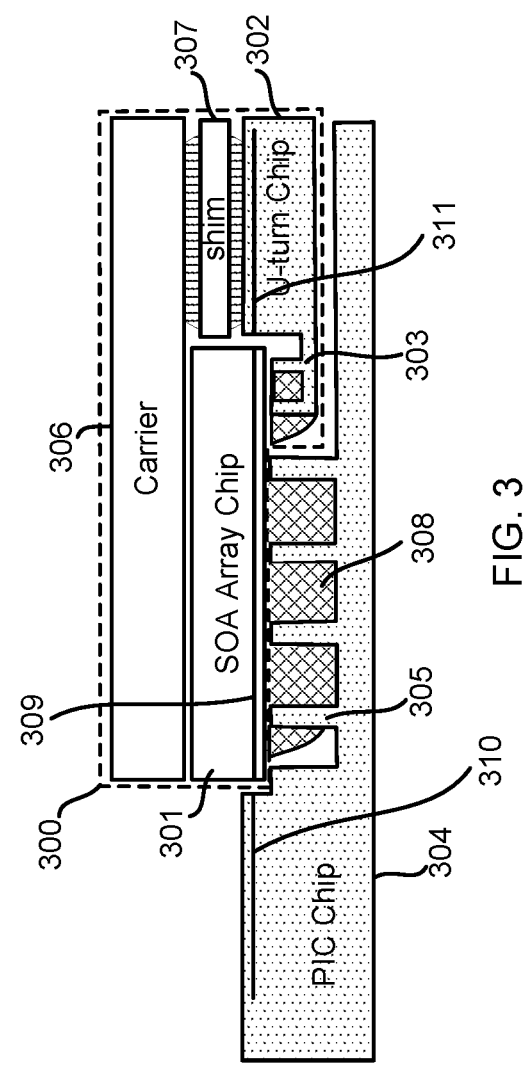
FIG. 3 depicts another embodiment of a cross section of an SOA array module coupled to a PIC chip.

FIG. 3 depicts another embodiment of a cross section of an SOA array module 300 coupled to a PIC chip 304. The SOA array module 300 simplifies the chip assembling process, resulting in lower cost for high volume production.

In this embodiment, the PIC chip 304 and a U-turn chip 302 are fabricated on a same wafer, so that waveguides 310 in the PIC 304 and waveguides 311 in the U-turn chip 302 are self-aligned in the vertical direction, i.e., they are at the same depth below the chip surface (e.g., are aligned in a same plane). Furthermore, patterned pedestals (e.g., pedestal 305) in the PIC chip 304 and patterned pedestals (e.g., pedestal 303) in the U-turn chip 302 are formed in such a way that, when the SOA chip 301 is positioned on these pedestals, waveguides 309 in the SOA chip 301 align with the waveguides 310 and 311 in the vertical direction. Since accurate vertical alignment in the chip assembling process effects performance, the mechanical constraints provided by the self-aligned waveguides 309, 310, and 311 and the properly formed pedestals significantly improve the yield and quality of the final chip assembly, which can lead to higher throughput and lower cost in manufacturing.

Figure 4A:
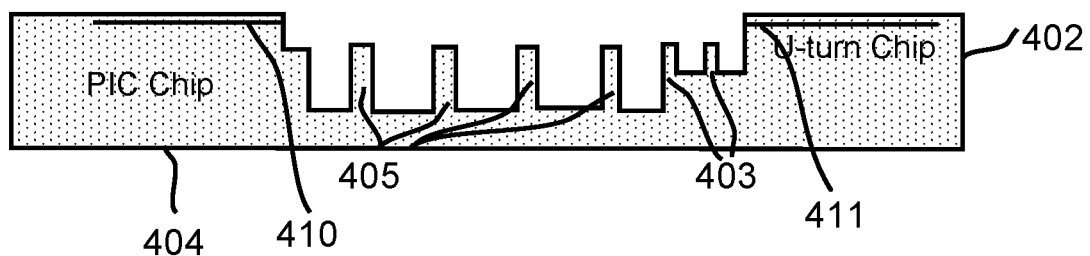
FIGS. 4A-B describe an example fabrication process, according to one or more embodiments.
Figure 4B:
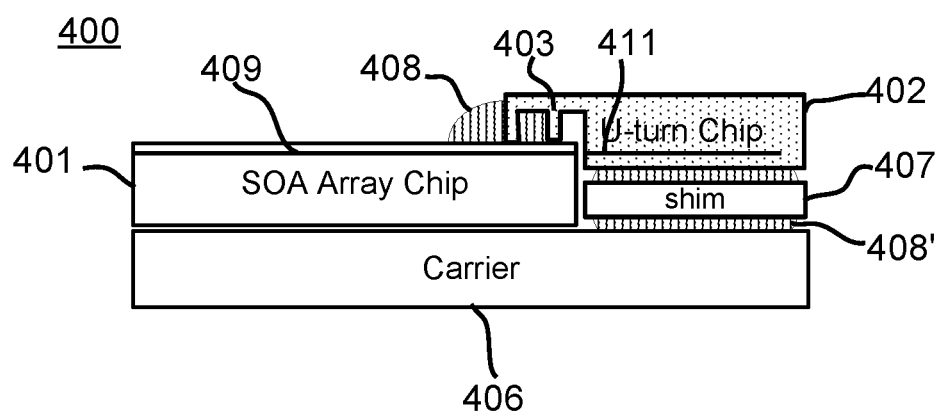

FIGS. 4A-B describe an example fabrication process, according to one or more embodiments. The process shown in FIGS. 4A-B may be performed by components of a circuit manufacturing system. Other entities may perform some or all of the steps in FIGS. 4A-B other embodiments. Embodiments may include different and/or additional steps, or perform the steps in different orders.

As shown in FIG. 4A, a PIC 404 and U-turn 402 are produced on a same wafer. The wafer may be made out of silicon, silicon nitride, silicon dioxide, some other suitable material or some combination thereof. Waveguides 410 and 411 are at a same depth below the wafer surface. Similarly pedestals 405 and pedestals 403 are formed such that the tops of pedestals 405 and the tops of the pedestals 403 are at a same depth below the wafer surface. Note that in the illustrated embodiment there are four pedestals 405 and two pedestals 403. In other embodiments, there may be more or less pedestals 405 and/or more or less pedestals 403.

FIG. 4B depicts how a SOA module 400 is assembled that includes a SOA array chip 401 and a U-turn chip 402. The U-turn chip 402 is cut from the wafer shown in FIG. 4A, and may be thinned down.

The SOA array chip 401 is bonded to a carrier 406. The carrier 406 may be an embodiment of the carrier 203. Then the U-turn chip 402 is flipped upside down, aligned, and bonded to the SOA array chip 401 with the pedestals 403 touching a top surface of the SOA array chip 401, thereby providing mechanical constraint in the vertical direction. Primary adhesion is supplied by an adhesive (e.g., solder or glue) 408 around the pedestals 403, while secondary adhesion may be added using low shrinkage glue 408', along with a shim 407 if necessary, between the U-turn chip 402 and the carrier 406 for better mechanical stability. Because the height of the pedestals 403 is precisely controlled, this approach allows for passive alignment between the SOA array chip 401 and the U-turn chip 402.

The SOA module 400 is then flipped upside down and bonded to the PIC chip 404. For example, as shown in FIG. 3 the SOA module 400 is then flipped upside down, aligned to the waveguide 310 in the PIC 304, and bonded with adhesive 308 in a recessed cavity that houses the pedestals of the PIC chip 304 (e.g., the pedestal 305) as mechanical stop ensuring vertical alignment of the assembly.

Figure 5A:
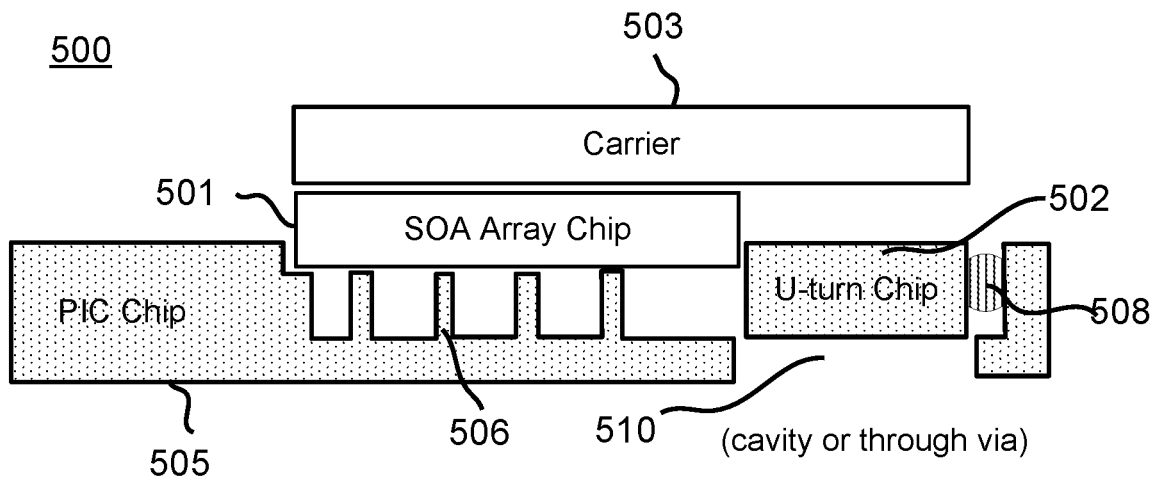
FIGS. 5A-B describes a PIC assembly that includes a suspended U-turn chip, according to one or more embodiments.
Figure 5B:
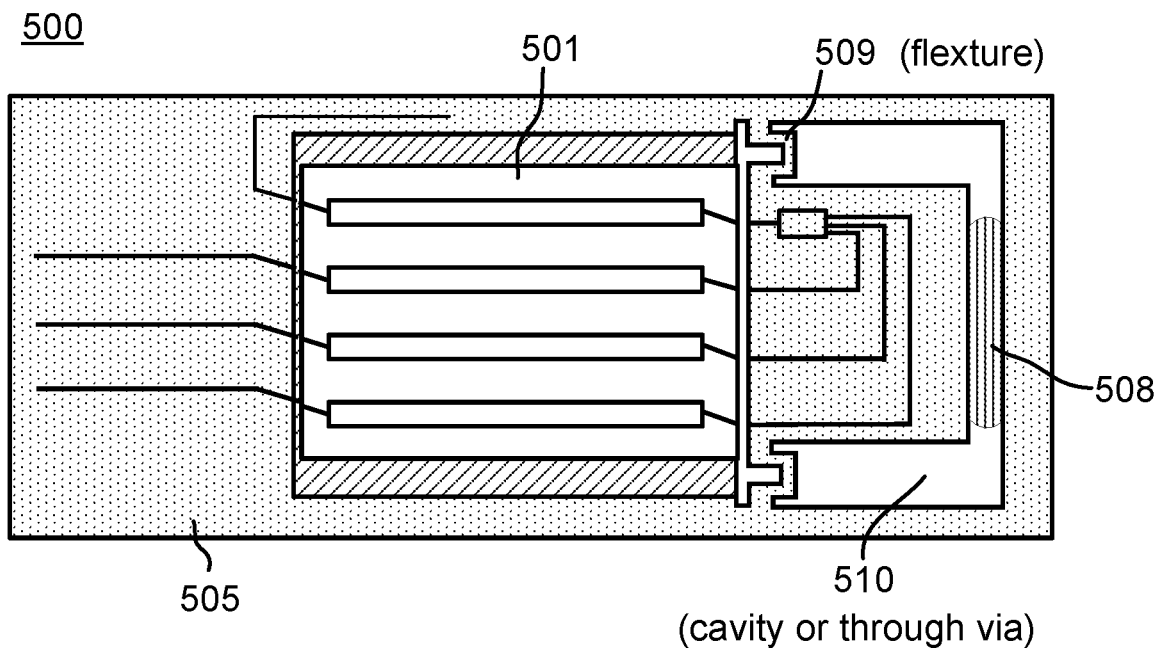

FIGS. 5A-B describes a PIC assembly 500 that includes a suspended U-turn chip 502, according to one or more embodiments. The PIC assembly 500 includes a PIC chip 505 that is connected to a suspended U-turn chip 502, and a SOA module. The SOA module includes a SOA array chip 501 and a carrier 503. FIG. 5A is a cross sectional view of the PIC assembly 500, and FIG. 5B is a top down view of the PIC assembly 500. The PIC chip 505 and the U-turn chip 502 are fabricated on a same wafer (e.g., similar to the embodiment described above with regard to FIG. 4A). Instead of cutting it off the wafer, the U-turn chip 502 is attached and suspended by flexure 509, when its bottom is hollowed out with a cavity or through via 510. The U-turn chip 502 has a little freedom to move in-plane while out-of-plane motion is constrained. This ensures vertical direction alignment between the PIC 505, an SOA array chip 501, and the U-turn chip 502, but allows left/right movement of the U-turn chip 502 in order to accommodate variation in the length of the SOA array chip 501. During assembly, the pre-assembled SOA 501 on carrier 503 is flipped, aligned, and bonded on pedestals (e.g., pedestal 506) of the PIC chip 505. Then the U-turn chip 502 is pushed toward the SOA array chip 501 and fixed permanently in position with adhesive 508 to form the PIC assembly 500.

Figure 6:
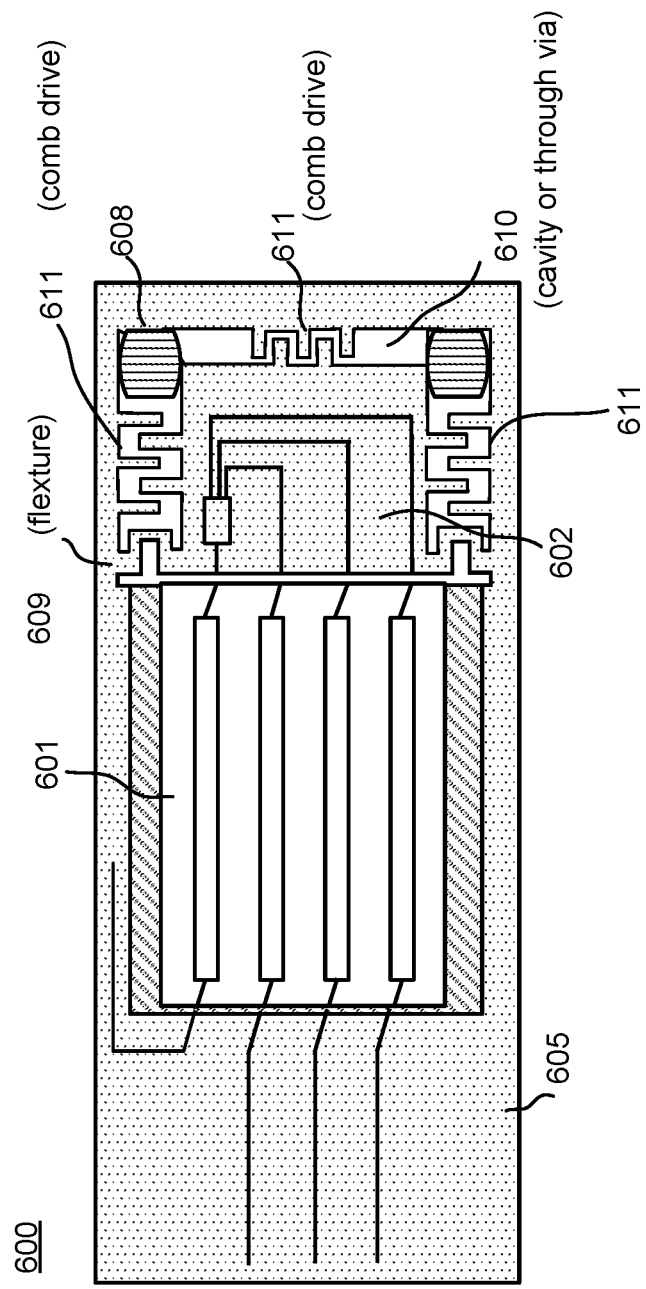
FIG. 6 describes a PIC assembly that includes a suspended U-turn chip and a plurality of comb drives, according to one or more embodiments.

FIG. 6 describes a PIC assembly 600 in which PIC chip 605 includes a suspended U-turn chip 602 and a plurality of comb drives 611, according to one or more embodiments. The comb drives 611 are added to use electro-static force to move the U-turn chip 602 in-plane. As illustrated the comb drives 611 are configured control translation of the U-turn chip 602 relative to a SOA array chip 601 in two orthogonal directions. The comb drives 611 are formed from portions of the U-turn chip 602 and the PIC chip 605, and are configured to position the U-turn chip 602 relative to the SOA array chip 601. Once waveguides in the SOA array chip 601 are aligned with those in the U-turn chip 602, an adhesive 608 is applied to permanently fix the U-turn chip 602 in position. While three comb drives 611 are illustrated, in other embodiments, the PIC chip 605 may include one or more comb drives 611.

Figure 7:
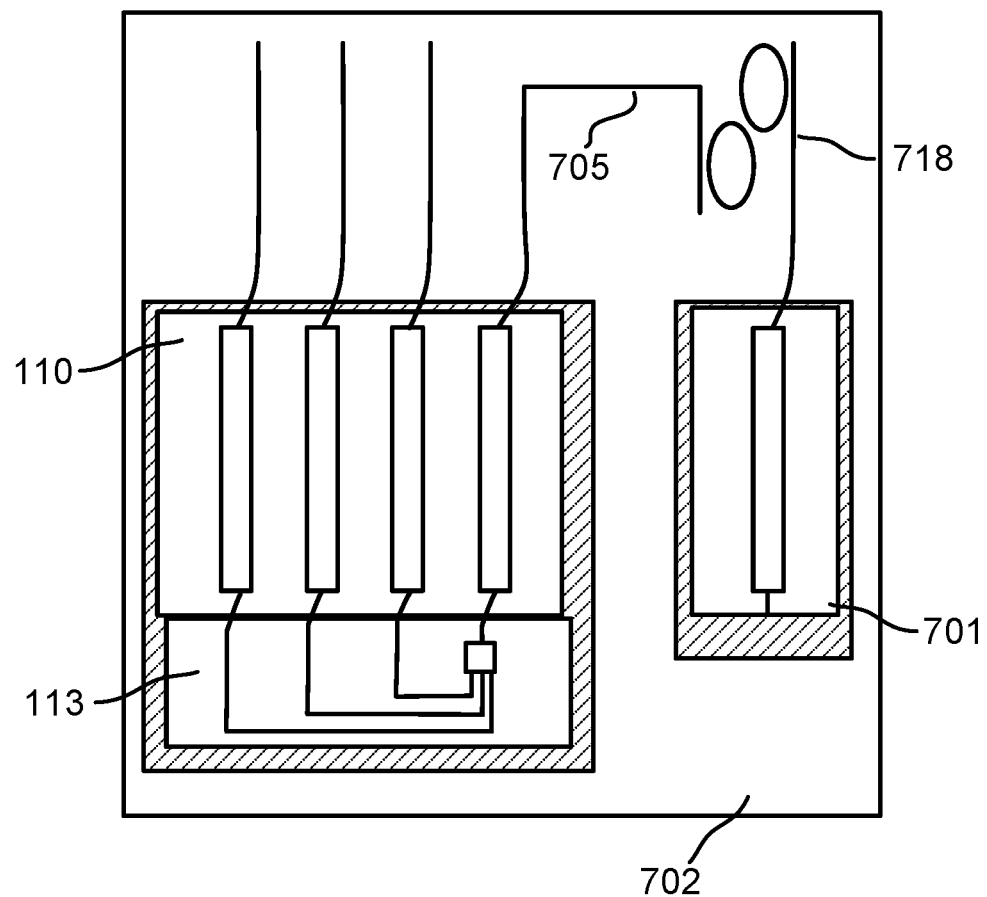
FIG. 7 shows a top-down view of a PIC assembly that includes an external cavity laser, according to one or more embodiments.

FIG. 7 shows a top-down view of a PIC assembly 700 that includes an external cavity laser, according to one or more embodiments. The PIC assembly 700 includes one SOA array chip 110 and one gain medium chip 701 packaged to a PIC chip 702 that includes a resonator 718, with the assistance of the U-turn chip 113. The gain medium chip 701 and the resonator 718 form the external cavity laser (ECL), which is the laser source in this embodiment. The resonator 718 and the gain medium chip 701 collectively select and amplify a specific band of the emitted light.

The light from the ECL source is coupled into the SOA array chip 110 via a waveguide 705. The SOA array chip 110 operates on the in-coupled light in the same manner as described above with regard to FIG. 1.

Additional Configuration Information

The figures and the preceding description relate to preferred embodiments by way of illustration only. It should be noted that from the preceding discussion, alternative embodiments of the structures and methods disclosed herein will be readily recognized as viable alternatives that may be employed without departing from the principles of what is claimed.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

Alternate embodiments are implemented in computer hardware, firmware, software, and/or combinations thereof. Implementations can be implemented in a computer program product tangibly embodied in a machine-readable storage device for execution by a programmable processor; and method steps can be performed by a programmable processor executing a program of instructions to perform functions by operating on input data and generating output. Embodiments can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits) and other forms of hardware.

What is claimed is:

1. A light detection and ranging (LiDAR) system for a vehicle comprising:
  a semiconductor optical amplifier (SOA) array chip that includes an input SOA and a plurality of SOAs, the SOA array chip having a particular chip facet, wherein an optical input to the input SOA and optical outputs from the plurality of SOAs are positioned on the particular chip facet of the SOA array chip; and
  an integrated optical chip including:
    an optical splitter configured to receive amplified input light propagating in a first direction from the input SOA, and divide the amplified input light into beams; and
    a waveguide assembly configured to guide the beams to a corresponding SOA of the plurality of SOAs, wherein the waveguide assembly adjusts a direction of propagation of the guided beams to be substantially parallel to a second direction, and wherein the plurality of SOAs are configured to amplify their respective beams to generate a plurality of amplified output beams.

2. The LiDAR system of claim 1, wherein the second direction is substantially opposite the first direction.

3. The LiDAR system of claim 1, further comprising:
  a photonic integrated circuit (PIC) chip that includes a front facet; and
  an SOA chip that is coupled to the PIC chip and that is configured to output the plurality of amplified output beams into the front facet.

4. The LiDAR system of claim 3, wherein the integrated optical chip is on an opposite side of the SOA chip than the front facet of the PIC chip.

5. The LiDAR system of claim 3, further comprising a carrier that is coupled to a first side of the SOA chip and a first side of a shim, wherein a second side of the SOA chip is coupled to a plurality of pedestals of the PIC chip, and a second side of the shim is coupled to the integrated optical chip, wherein the carrier is configured to provide thermal and structural support to the SOA chip.

6. The LiDAR system of claim 3, wherein the integrated optical chip and the PIC chip are fabricated on a particular wafer.

7. The LiDAR system of claim 6, wherein at least one waveguide in the waveguide assembly is aligned with at least one waveguide in the PIC chip.

8. The LiDAR system of claim 6, wherein the integrated optical chip is coupled to and suspended from the PIC chip through one or more flexures.

9. The LiDAR system of claim 8, wherein the one or more flexures are fabricated on the particular wafer.

10. The LiDAR system of claim 1, further comprising:
  a second SOA array chip, that includes a second input SOA and a second plurality of SOAs, and the second input SOA and the second plurality of SOAs are arranged parallel to one another and parallel to the SOAs of the SOA array chip.

11. The LiDAR system of claim 10, further comprising:
  a laser source configured to emit light; and
  an optical divider configured to split the light into at least a first beam and a second beam, the first beam provided to the SOA array chip, and the second beam provided to the second SOA array chip.

12. The LiDAR system of claim 11, further comprising a first waveguide and a second waveguide, the first waveguide configured to provide the first beam to the SOA array chip, and the second waveguide configured to provide the second beam to the second SOA array chip, wherein a direction of propagation of the light at entrances of the first waveguide and the second waveguide is substantially opposite a direction of propagation at respective outputs of the first waveguide and the second waveguide.

13. The LiDAR system of claim 1, wherein the SOA array is on an SOA chip that is coupled to a PIC chip, the LiDAR system further comprising:
an external cavity laser (ECL) source coupled to the PIC chip, the ECL source configured to provide light to the SOA chip, the ECL source comprising:
a light source configured to emit light,
a gain medium chip, and
a resonator, wherein the resonator and the gain medium chip collectively select and amplify a specific band of the emitted light.

14. The LiDAR system of claim 1, wherein the plurality of SOAs is configured to provide a same level of amplification.

15. The LiDAR system of claim 1, wherein the plurality of SOAs includes a first SOA and a second SOA, and the first SOA and the second SOA are configured to provide different respective amounts of amplifications.

16. The LiDAR system of claim 1, wherein the LiDAR system is part of a frequency modulated continuous wave (FMCW) LiDAR system.

17. A semiconductor optical amplifier (SOA) module for a light detection and ranging (LiDAR) system of a vehicle, the SOA module comprising:
a SOA array on a SOA chip having a particular chip facet, the SOA array including an input SOA and a plurality of SOAs, wherein an optical input to the input SOA and optical outputs from the plurality of SOAs are positioned on the particular chip facet of the SOA chip; and
a U-turn chip coupled to the SOA chip, the U-turn chip including:
an optical splitter configured to receive amplified input light propagating in a first direction from the input SOA, and divide the amplified input light into a beams; and
a waveguide assembly configured to guide the beams to a corresponding SOA of the plurality of SOAs, wherein the waveguide assembly adjusts a direction of propagation of the guided beams to be substantially parallel to a second direction that is substantially opposite the first direction, and wherein the plurality of SOAs are configured to amplify their respective beams to generate a plurality of amplified output beams.

18. The SOA module of claim 17, further comprising a carrier and a shim, wherein the carrier is separated from the U-turn chip by the shim.

19. The SOA module of claim 18, wherein the shim is sized such that a waveguide of the SOA array and a waveguide of the U-turn chip are aligned in a same plane.

20. A vehicle comprising:
a light detection and ranging system (LiDAR) including:
a semiconductor optical amplifier SOA array on a SOA chip having a front chip facet, the SOA array including an input SOA and a plurality of SOAs, wherein an optical input to the input SOA and optical outputs from the plurality of SOAs are positioned on the front chip facet of the SOA chip; and
an integrated optical chip coupled to the SOA chip, the integrated optical chip including:
an optical splitter configured to receive amplified input light propagating in a first direction from the input SOA, and divide the amplified input light into a beams; and
a waveguide assembly configured to guide the beams to a corresponding SOA of the plurality of SOAs, wherein the waveguide assembly, adjusts a direction of propagation of the guided beams to be substantially parallel to a second direction that is substantially opposite the first direction.

* * * * *